(12) United States Patent
Wu et al.

(10) Patent No.: US 8,012,825 B2
(45) Date of Patent: Sep. 6, 2011

(54) METHOD OF MANUFACTURING THE DOUBLE-IMPLANT NOR FLASH MEMORY STRUCTURE

(75) Inventors: Yider Wu, Chu-Pei (TW); Yung-Chung Lee, Chu-Pei (TW); Yi-Hsiu Chen, Chu-Pei (TW)

(73) Assignee: EON Silicon Solutions Inc., Chu-Pei (TW)

( * ) Notice: Subject to any disclaimer, the term of this patent is extended or adjusted under 35 U.S.C. 154(b) by 359 days.

(21) Appl. No.: 12/350,298

(22) Filed: Jan. 8, 2009

(65) Prior Publication Data

US 2010/0171161 A1    Jul. 8, 2010

(51) Int. Cl.
*H01L 21/336* (2006.01)

(52) U.S. Cl. . 438/257; 438/201; 438/211; 257/E21.409; 257/E29.001

(58) Field of Classification Search ................ 438/257, 438/283, 201, 211, 264; 257/E21.409, E29.001, 257/E29.3

See application file for complete search history.

(56) References Cited

U.S. PATENT DOCUMENTS

| 6,133,096 A | * | 10/2000 | Su et al. | 438/264 |
| 6,501,114 B2 | * | 12/2002 | Cho et al. | 257/296 |
| 2004/0166634 A1 | * | 8/2004 | Lee et al. | 438/262 |
| 2009/0246927 A1 | * | 10/2009 | Wiatr et al. | 438/305 |

* cited by examiner

*Primary Examiner* — Thanh Nguyen

(74) *Attorney, Agent, or Firm* — Schmeiser, Olsen & Watts LLP

(57) ABSTRACT

In a method of manufacturing a double-implant NOR flash memory structure, a phosphorus ion implantation process is performed, so that a P-doped drain region is formed in a semiconductor substrate between two gate structures to overlap with a highly-doped drain (HDD) region and a lightly-doped drain (LDD) region. Therefore, the electric connection at a junction between the HDD region and the LDD region is enhanced and the carrier mobility in the memory is not lowered while the problems of short channel effect and punch-through of LDD region are solved.

6 Claims, 10 Drawing Sheets

US 8,012,825 B2

METHOD OF MANUFACTURING THE DOUBLE-IMPLANT NOR FLASH MEMORY STRUCTURE

FIELD OF THE INVENTION

The present invention relates to a NOR flash memory structure, and more particularly to a double-implant NOR flash memory structure and a method for manufacturing the same.

BACKGROUND OF THE INVENTION

A flash memory is a non-volatile memory, which can maintain the information stored thereon even when no power is supplied thereto. This means an electronic device using the flash memory does not need to waste electric power for memorizing data. The flash memory is also rewritable, small in volume with high memory capacity, and easy to carry. Therefore, flash memories are particularly suitable for use with portable devices. Currently, NOR flash memories have been used not only on motherboards of computers for storing BIOS (basic input/output system) data, but also on mobile phones and hand-held devices for storing system data. In addition, the flash memory offers fast read access speed to satisfy the demands for quick boot speed of hand-held devices.

With the progress in different technical fields, the process technique for flash memory also moves into the era of nanometer technology. For the purpose of increasing the device operating speed, increasing the device integration, and reducing the device operating voltage, it has become a necessary trend to reduce the gate channel length and the oxide layer thickness of the device. The reduction of device dimensions increases not only the density of integrated circuit (IC) per unit area, but also the current driving ability of the device. However, there are also problems caused by such reduction of device dimensions. For example, the gate linewidth of the device has been reduced from the past micron scale ($10^{-6}$ meter) to the current nano scale ($10^{-9}$ meter), and the short channel effect (SCE) becomes more serious with the reduction of device dimensions and gate linewidth. One of the solutions to avoid influences of short channel effect on the device is to reduce the source/drain junction depth.

For instance, the lightly-doped drain (LDD) enables the device to have an increased breakdown voltage, improved critical voltage property, and reduced hot carrier effect. While the LDD reduces the high electric field at the drain junction and effectively upgrades the reliability of the device, the LDD with shallow junction depth tends to be punched through in the etching process for forming contact hole to thereby damage the memory structure. To avoid damage of memory structure due to punch-through of the LDD, a highly-doped ion implantation process would usually be performed to implant a highly-doped drain (HDD) region to overlap with the LDD region. As a result, the flash memory structure can have a reduced drain junction depth to improve the short channel effect while the lightly-doped drain region is protected from being punched through during an etching process for forming contact hole.

However, as can be seen from FIG. 10, which is a sectional view of a conventional flash memory structure, when the above-described highly-doped ion implantation process is performed to form an HDD region 134 to overlap with an LDD region 132 between two gate structures 130, a junction 136 between the HDD region 134 and the LDD region 132 would have a relatively weak electric connection. When the LDD region is further reduced in the junction depth to avoid the short channel effect, the electric connection between the HDD region 134 and the LDD region 132 will become weaker to adversely affect the carrier mobility in the flash memory.

Therefore, it is very important to solve the problem of weak electric connection at the junction between the HDD region and the LDD region while the problems of short channel effect and punch-through of LDD region are avoided, so that the carrier mobility in the memory would not become lowered.

SUMMARY OF THE INVENTION

A primary object of the present invention is to provide a double-implant NOR flash memory structure and a method of manufacturing the same, so that the electric connection at a junction between an HDD region and an LDD region is enhanced and the carrier mobility in the memory is not lowered while the problems of short channel effect and punch-through of LDD region are solved.

To achieve the above and other objects, a double-implant NOR flash memory structure according to the present invention includes a semiconductor substrate having two gate structures formed thereon; an LDD region located in the semiconductor substrate between the two gate structures; two first source regions located in the semiconductor substrate at two outer sides of the two gate structures, and the first source regions each having a junction depth in the semiconductor substrate deeper than that of the LDD region; a HDD region located in the semiconductor substrate between the two gate structures to overlap with the LDD region, and the HDD region having a junction depth in the semiconductor substrate deeper than that of the LDD region; a P-doped drain region located in the semiconductor substrate between the two gate structures to overlap with the HDD region and the LDD region; two salicide layers separately located atop the two gate structures; and a barrier plug for isolating the two gate structures from each other.

And, to achieve the above and other objects, the method of manufacturing a double-implant NOR flash memory structure according to the present invention includes the following steps: providing a semiconductor substrate; forming two gate structures on the semiconductor substrate; performing a lightly-doped ion implantation process, so that a lightly-doped drain (LDD) region is formed in the semiconductor substrate between the two gate structures, and two lightly-doped source regions are formed in the semiconductor substrate at two outer sides of the two gate structures; and then further performing a source region ion implantation process, so that two first source regions are formed in the semiconductor substrate at two outer sides of the two gate structures, wherein the first source regions each have a junction depth in the semiconductor substrate deeper than that of the LDD region; forming two facing spacer walls between the two gate structures, and the two facing spacer walls being located above the LDD region; performing a highly-doped ion implantation process, so that a highly-doped drain (HDD) region is formed between the two gate structures to overlap with the LDD region, and the HDD region having a junction depth in the semiconductor substrate deeper than that of the LDD region; performing a phosphorus ion implantation process, so that a P-doped drain region is formed in the semiconductor substrate between the two gate structures to overlap with the HDD region and the LDD region; and forming a barrier plug between the two gate structures.

With the above arrangements and the above manufacturing method, the double-implant NOR flash memory structure according to the present invention has a lightly-doped drain region that is not subject to punch-through during forming the contact hole by etching, and allows more stable data write-in and data erase procedures, enabling the NOR flash memory to have increased reliability and extended service life.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
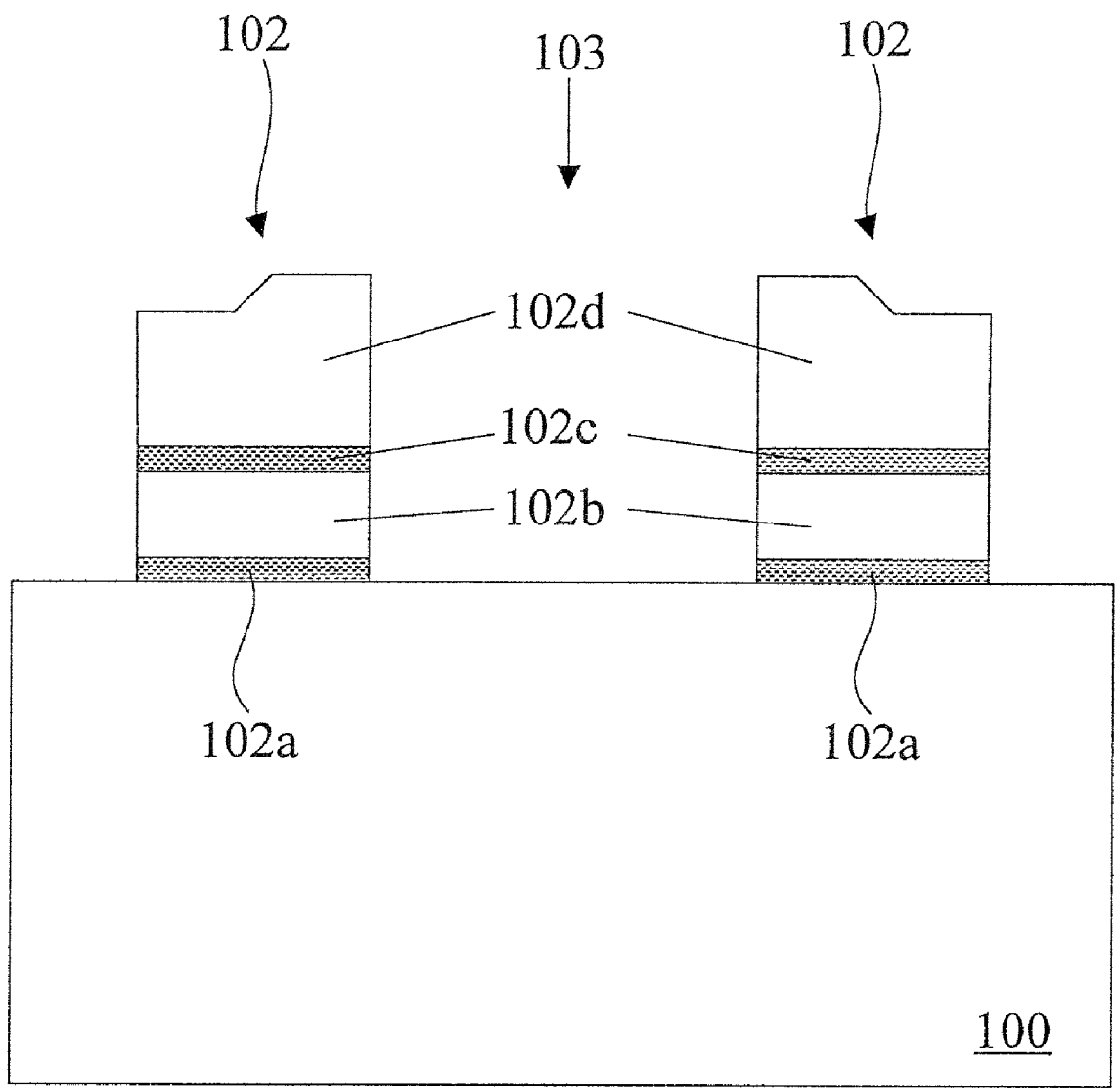
FIGS. 1 to 9 are schematic sectional views of a NOR flash memory structure at different stages when being manufactured using a method the present invention.

The present invention will now be described with a preferred embodiment thereof. For the purpose of easy to understand, elements that are the same in the illustrated preferred embodiment and the accompanying drawings are denoted by the same reference numerals.

Please refer to FIG. 1, which is a fragmentary sectioned side view showing some basic parts of the NOR flash memory structure of the present invention. As shown, the NOR flash memory has a semiconductor substrate 100, on which two gate structures 102 are formed. Each of the gate structures 102 includes a tunneling oxide layer 102a, a floating gate 102b, a dielectric layer 102c, and a control gate 102d. A channel 103 is also formed on the semiconductor substrate 100 between the two gate structures 102. The material for the semiconductor substrate 100 can be silicon, silicon-germanium (SiGe), silicon on insulator (SOI), silicon germanium on insulator (SGOI), or germanium on insulator (GOI). In the illustrated embodiments of the present invention, the semiconductor substrate 100 is a silicon substrate.

Figure 2:
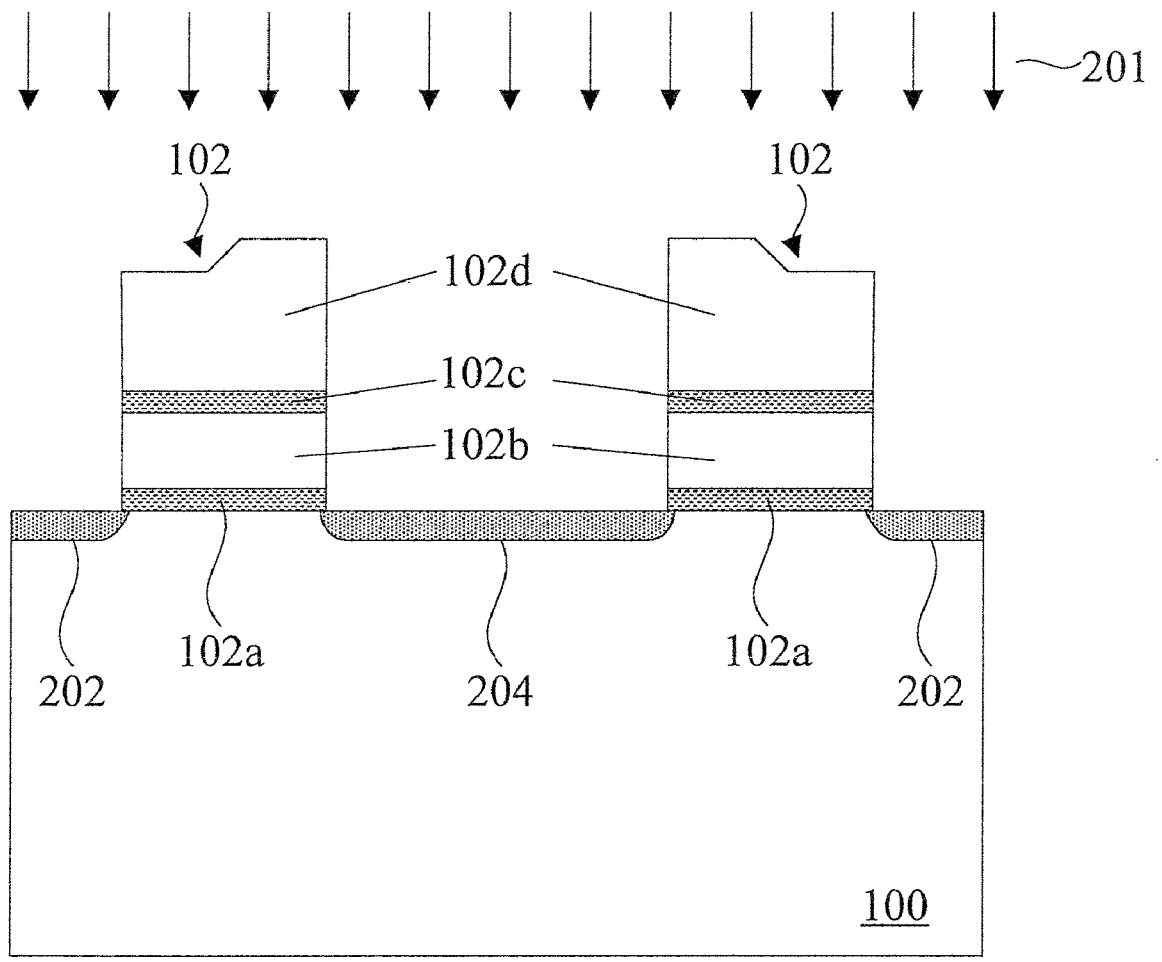

FIG. 2 shows the performing of a lightly-doped ion implantation process 201 on the semiconductor substrate 100. That is, by performing a lightly-doped drain implantation, two lightly-doped source regions 202 and a lightly-doped drain (LDD) region 204 are formed on the semiconductor substrate 100 having the two gate structures 102 formed thereon. In the illustrated embodiment of the present invention, the semiconductor substrate 100 is a p-type semiconductor structure, and arsenic (As) ions are used in the lightly-doped ion implantation process 201 at an implant dose of about $1 \times 1^{14} \sim 7 \times 10^{14}$ ion/cm$^2$ and with an implant energy of about 10~30 KeV. In the illustrated embodiment of the present invention, the two lightly-doped source regions 202 and the lightly-doped drain (LDD) region 204 each are an n-type doped region, and have a junction depth of about 200 Å in the semiconductor substrate 100.

Figure 3:
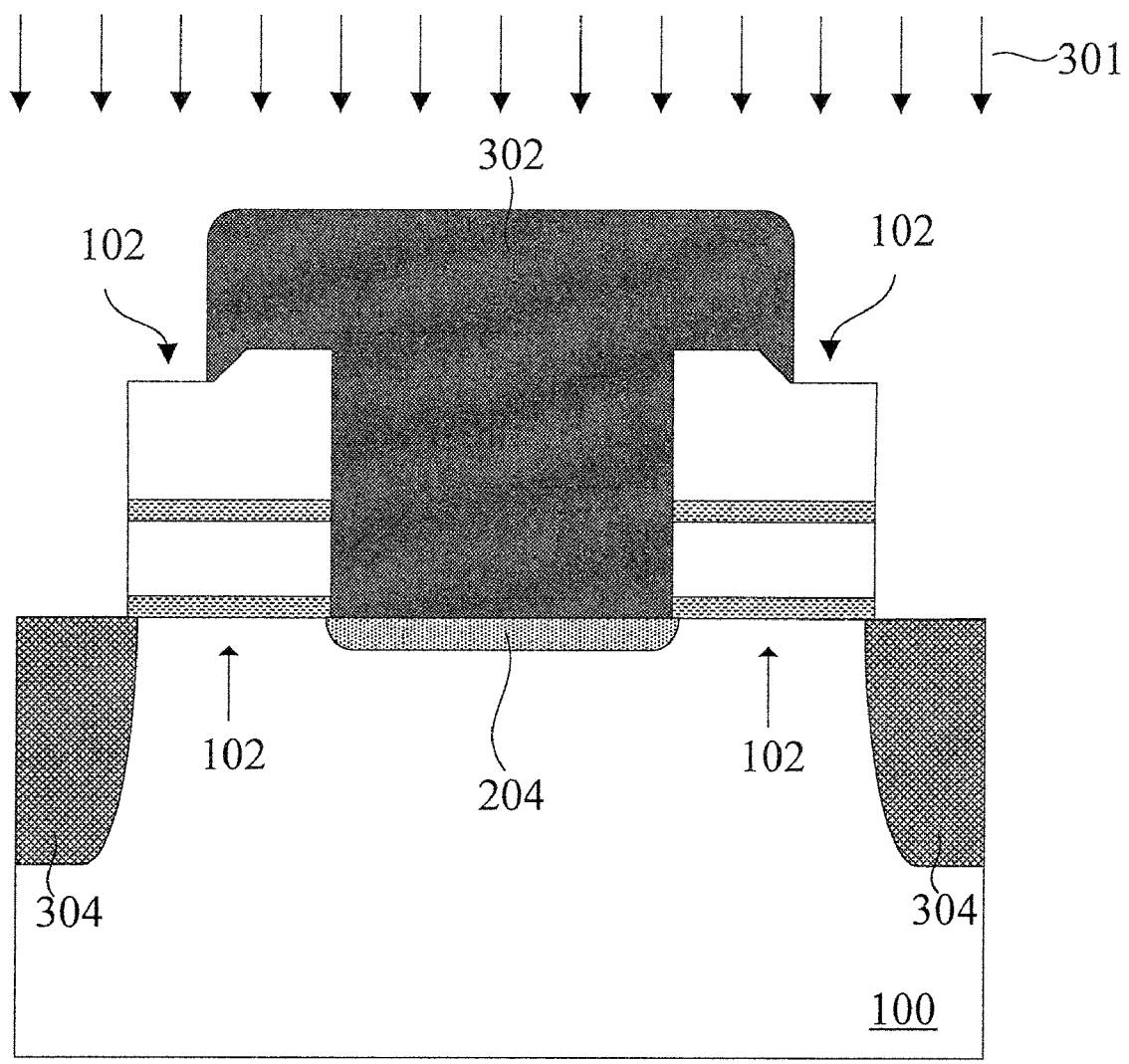

Please refer to FIG. 3 along with FIG. 2. A mask 302 is formed on the semiconductor substrate 100, and the LDD region 204 is covered by the mask 302. Then, a source region ion implantation process 301 is performed to increase the ion implantation depth of the two lightly-doped source regions 202 in the semiconductor substrate 100, so as to form two first source regions 304. The first source regions 304 are not symmetric with respect to the LDD region 204. Similarly, in the p-type semiconductor structure, arsenic (As) ions are used in the source region ion implantation process 301 at an implant dose of about $1 \times 10^{14} \sim 7 \times 10^{15}$ ion/cm$^2$ and with an implant energy of about 10~30 KeV. In the illustrated embodiment of the present invention, the first source regions 304 each are an n-type doped source region, and have a junction depth of about 500~1500 Å in the semiconductor substrate 100.

Figure 4:
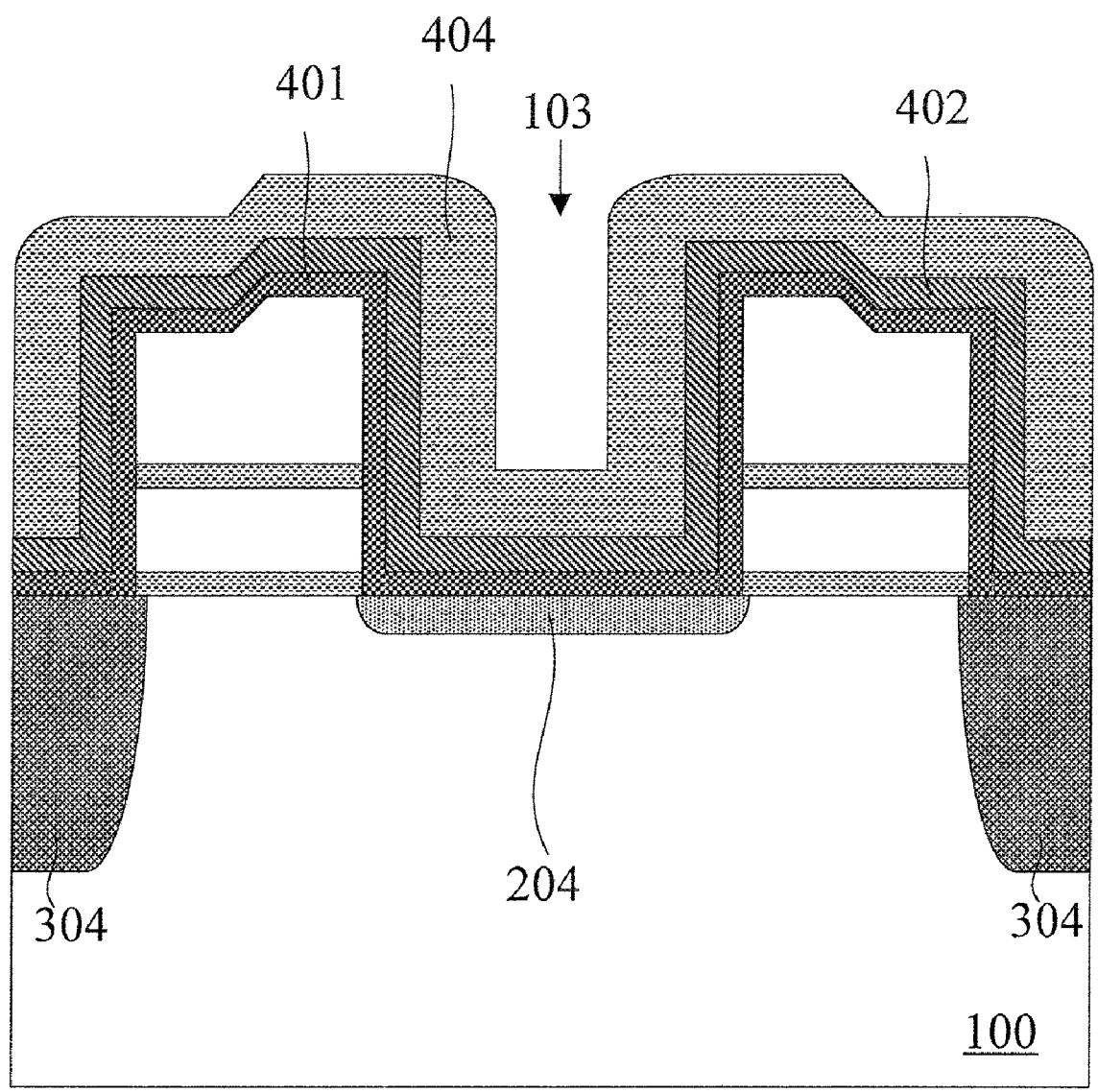

Please refer to FIG. 4. A first oxide wall 401 and a second oxide or nitride layer 402 are formed on the semiconductor substrate 100. And then, an dielectric layer 404 (such like SiOx, SiNx, SiOx/SiNx/SiOx etc.) is deposited through a known deposition technique, such as chemical vapor deposition (CVD) process that uses NH$_3$ and SiH$_4$ as the source gases, rapid thermal chemical vapor deposition (RTCVD) process, or atomic layer deposition (ALD) process. The dielectric layer 404 can have a deposition thickness ranged from 200 Å to 1500 Å. In the illustrated embodiment of the present invention, the deposition thickness of the dielectric layer 404 is about 750 Å.

Figure 5:
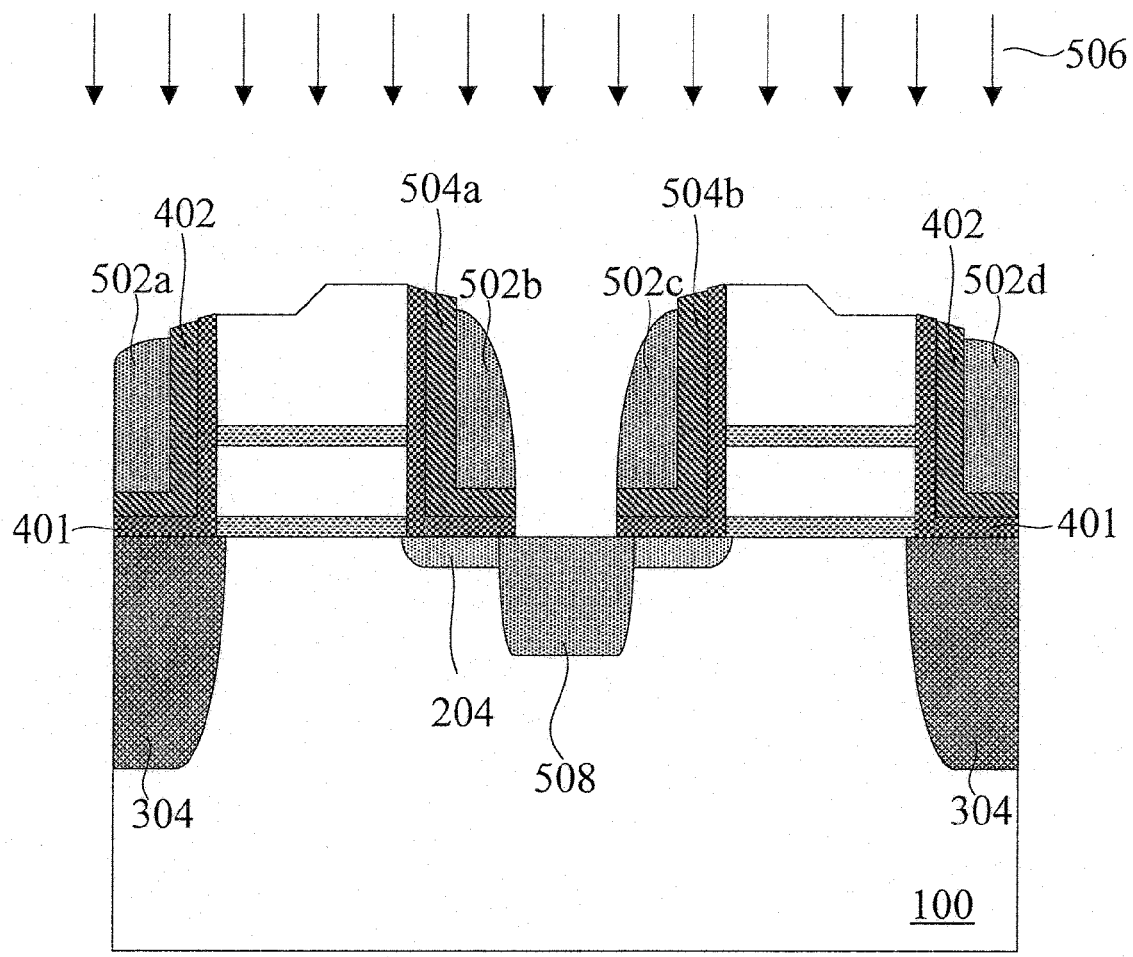

Please refer to FIGS. 4 and 5 at the same time. An etching process, such as dry etching or wet etching, is then performed, so that the dielectric layer 404 is etched to form a plurality of dielectric spacers 502a~502d. These dielectric spacers 502a~502d could be L-shaped or fan-shaped. Thereafter, a further etching process is performed, so that the second oxide or nitride layer 402 is etched to form two facing L-shaped or fan-shaped spacer walls 504a, 504b in the channel 103 between the two gate structures 102, and the first oxide wall 401 is also etched. Then, an HDD ion implantation process 506 is performed to form a highly-doped drain region (HDD) 508 between the two gate structures 102. In the HDD ion implantation process 506, arsenic (As) ions are used at an implant dose of about $5 \times 10^{14} \sim 8 \times 10^{15}$ ion/cm$^2$ and with an implant energy of about 20~55 KeV. The HDD region 508 overlaps with the LDD region 204, and has a junction depth in the semiconductor substrate 100 about 600 Å. In the illustrated embodiment, the HDD region 508 is an n-type doped region.

Figure 6:
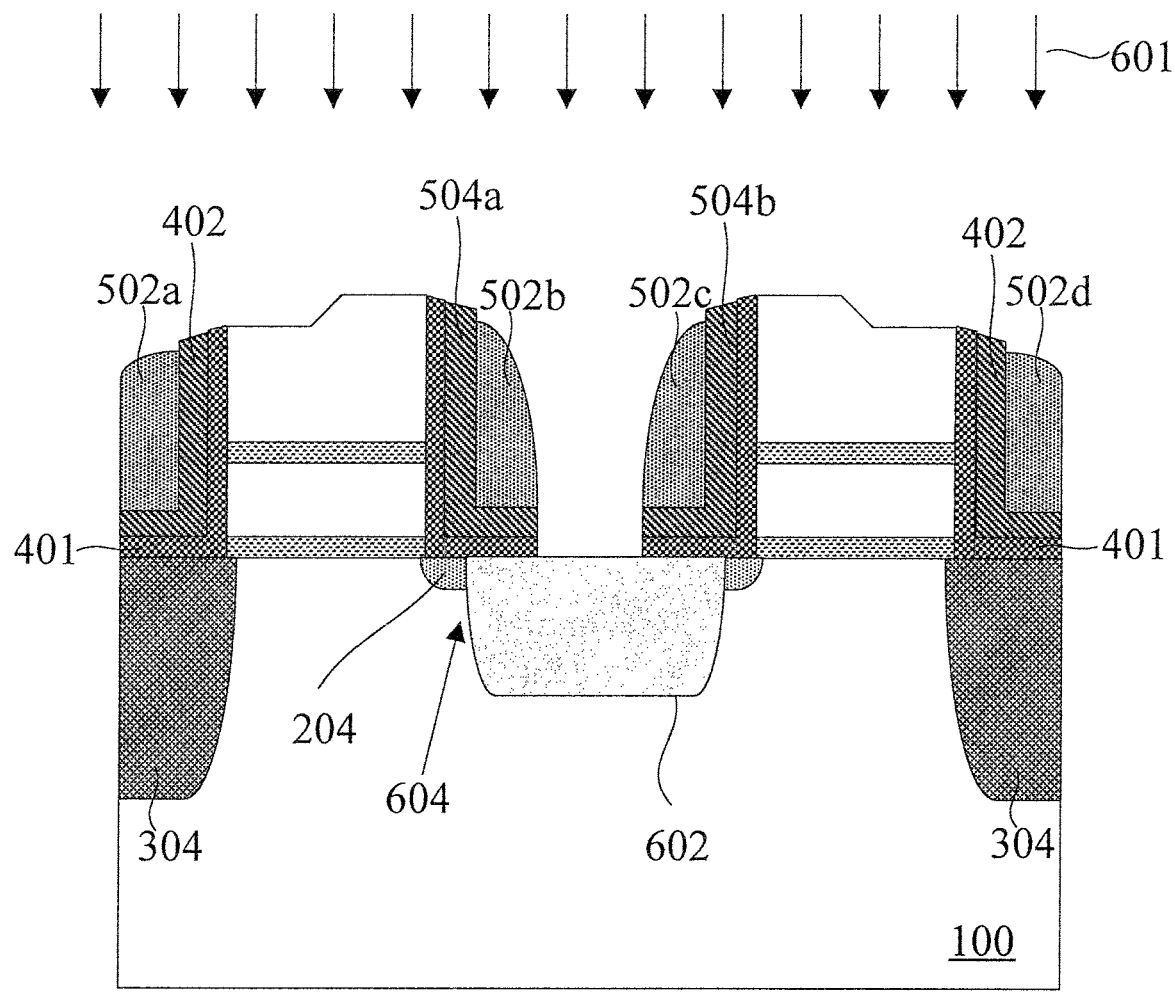

Please refer to FIGS. 5 and 6 at the same time. A phosphorus ion implantation process 601 is performed to form a P-doped drain region 602 between the two gate structures 102 to overlap with the HDD region 508 and the LDD region 204. In the phosphorus ion implantation process 601, phosphorus ions are used at an implant dose of about $1 \times 10^{15} \sim 8 \times 10^{15}$ ion/cm$^2$ and with an implant energy of about 20~50 KeV. The P-doped drain region 602 has a junction depth of about 200 Å in the semiconductor substrate 100. With the implantation of the P-doped drain region 602, an enhanced electric connection at a junction 604 between the LDD region 204 and the HDD region 508 can be obtained, and the carrier mobility in the memory would not become reduced.

Figure 7:
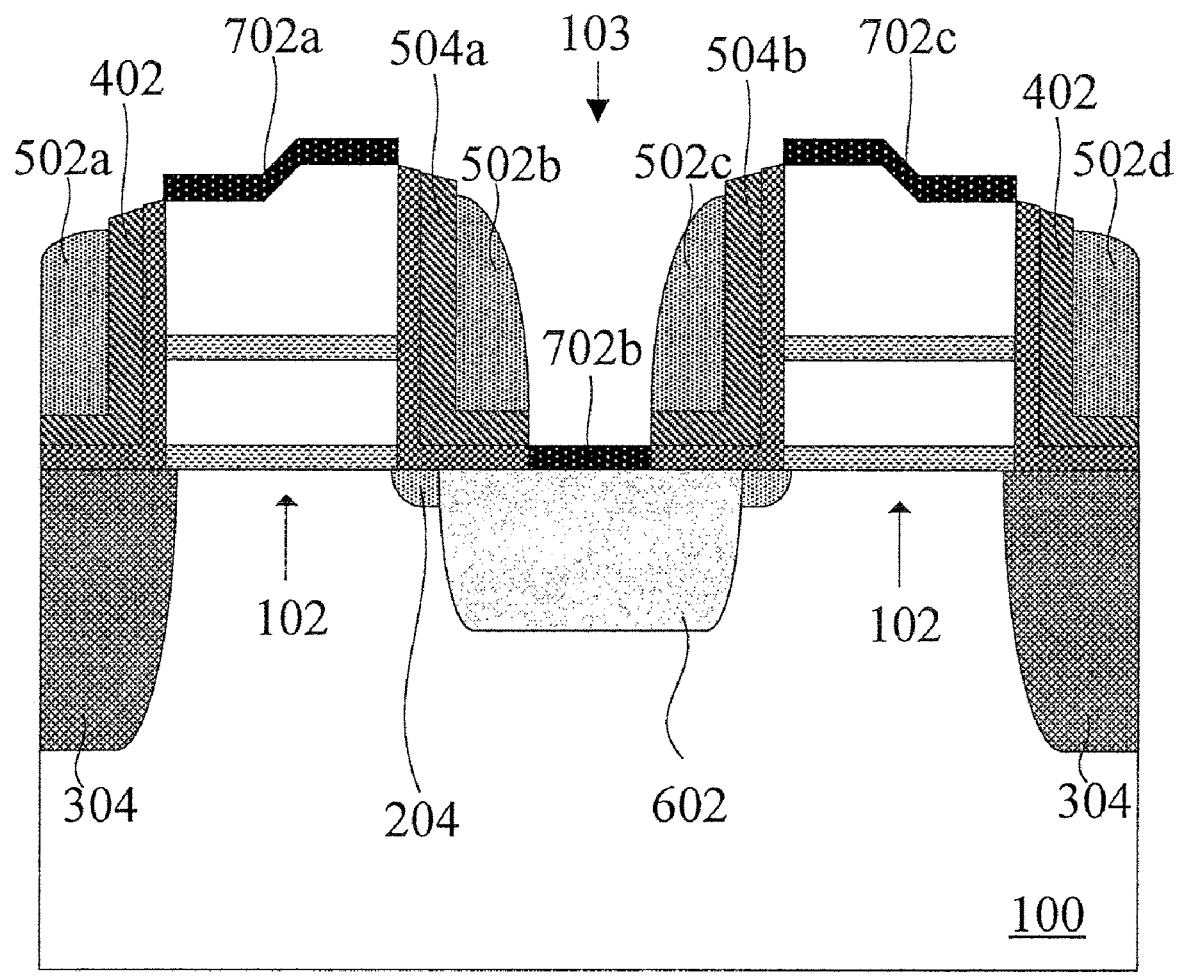

In FIG. 7, a metal silicide layer consisting of cobalt (Co), titanium (Ti), nickel (Ni), or molybdenum (Mo) is formed atop the device obtained in the above step as shown in FIG. 6, and a rapid thermal treatment process is performed, so that three salicide layers 702a, 702b, 702c are separately formed to reduce parasitic resistance and increase device driving force of the flash memory device.

Figure 8:
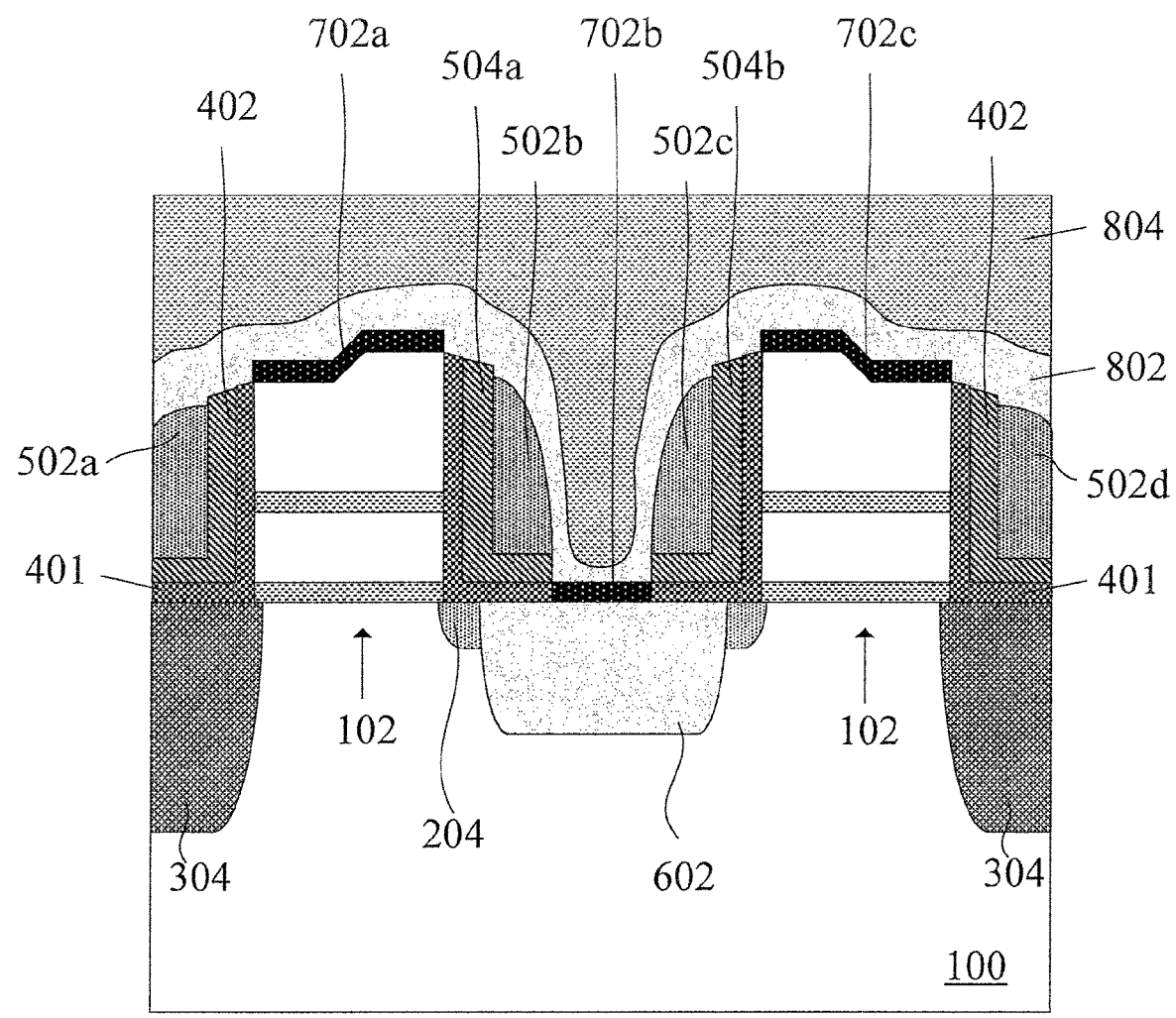

Please refer to FIG. 8. After the above-described steps, a contact etch stop layer (CESL) 802 is deposited on the semiconductor substrate 100. The CESL 802 can be SiN, silicon oxynitride, silicon oxide, etc. In the illustrated embodiment of the present invention, the CESL 802 is SiN. The CESL 802 has a deposition thickness ranged from 100 Å to 1500 Å. Thereafter, an inter-layer dielectric (ILD) layer 804, such as SiO$_2$, is deposited on the CESL 802.

Figure 9:
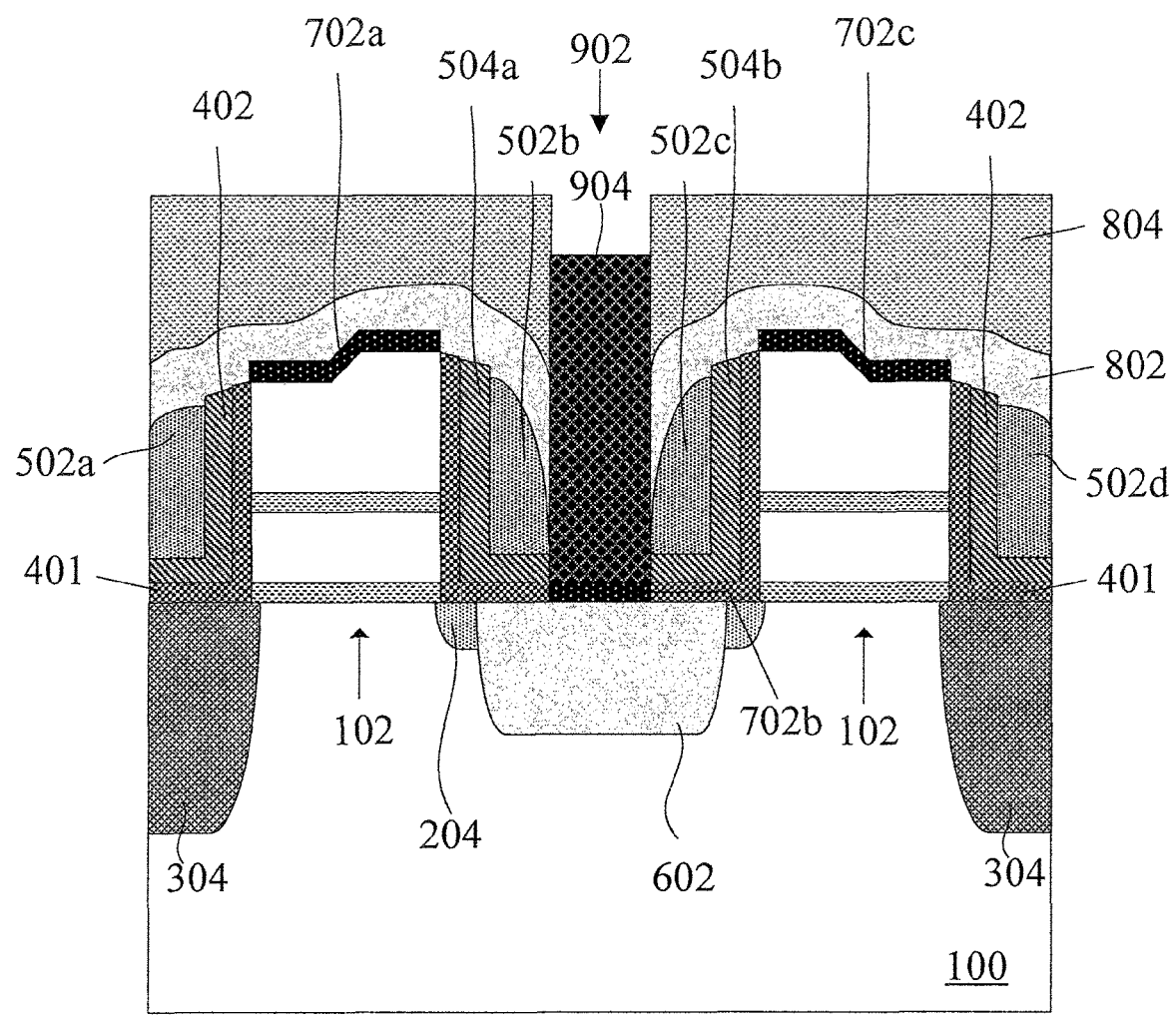
Figure 10:
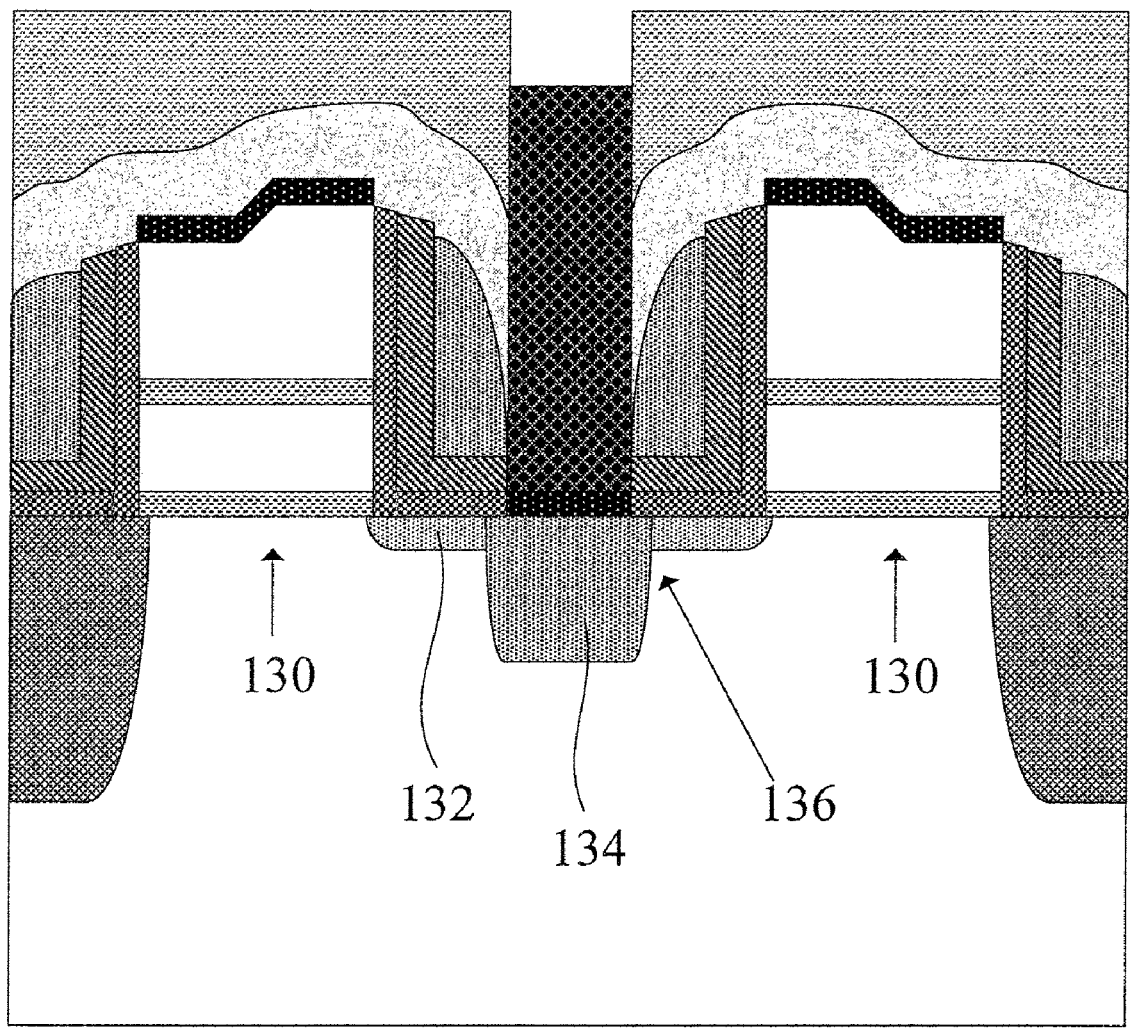
FIG. 10 is a sectional view of a conventional flash memory structure.

Finally, through a known photoresist and mask process, a contact hole 902 is formed in the channel 103 by anisotropic etching to extend from the inter-layer dielectric 804 to the CESL 802. Then, a barrier plug 904 is deposited in the contact hole 902 to complete the double-implant NOR flash memory structure according to the present invention, as shown in FIG. 9.

The present invention has been described with a preferred embodiment thereof and it is understood that the illustrated preferred embodiment is used only to describe part of the structure of a memory cell manufactured using the method of the present invention and is not intended to limit the scope of the present invention. It is also understood many changes and modifications in the described embodiment can be carried out without departing from the scope and the spirit of the invention that is intended to be limited only by the appended claims.

What is claimed is:

1. A method of manufacturing a double-implant NOR flash memory structure, comprising the following steps:
    providing a semiconductor substrate;
    forming two gate structures on the semiconductor substrate;
    performing a lightly-doped ion implantation process, so that a lightly-doped drain (LDD) region is formed in the semiconductor substrate between the two gate structures, and two lightly-doped source regions are formed in the semiconductor substrate at two outer sides of the two gate structures; and then further performing a source region ion implantation process, so that two first source regions are formed in the semiconductor substrate at two outer sides of the two gate structures; wherein the first source regions each have a junction depth in the semiconductor substrate deeper than that of the LDD region;
    forming two facing spacer walls between the two gate structures, and the two facing spacer walls being located above the LDD region;
    performing a highly-doped ion implantation process, so that a highly-doped drain (HDD) region is formed between the two gate structures to overlap with the LDD region, and the HDD region having a junction depth in the semiconductor substrate deeper than that of the LDD region;
    performing a phosphorus ion implantation process, so that a P-doped drain region is formed in the semiconductor substrate between the two gate structures to overlap with the HDD region and the LDD region; and
    forming a barrier plug between the two gate structures.

2. The method as claimed in claim 1, wherein the step of forming two facing spacer walls between the two gate structures further comprising the following steps:
    depositing an dielectric layer on the two facing spacer walls;
    etching the dielectric layer to the top surface of the LDD region; and
    forming a salicide layer on each of the two gate structures and the LDD region.

3. The method as claimed in claim 1, wherein arsenic ions are used in the lightly-doped ion implantation process at an implant dose of about $1\times10^{14}$~$7\times10^{14}$ ion/cm$^2$ and with an implant energy of about 10~30 KeV.

4. The method as claimed in claim 1, wherein arsenic ions are used in the source region ion implantation process at an implant dose of about $1\times10^{14}$~$7\times10^{15}$ ion/cm$^2$ and with an implant energy of about 10~30 KeV.

5. The method as claimed in claim 1, wherein arsenic ions are used in the highly-doped ion implantation process at an implant dose of about $5\times10^{14}$~$8\times10^{15}$ ion/cm$^2$ and with an implant energy of about 20~55 KeV.

6. The method as claimed in claim 1, wherein phosphorus ions are used in the phosphorus ion implantation process at an implant dose of about $1\times10^{15}$~$8\times10^{15}$ ion/cm$^2$ and with an implant energy of about 20~50 KeV.

* * * * *